United States Patent [19]

Chantre et al.

[11] Patent Number: 5,340,757
[45] Date of Patent: Aug. 23, 1994

[54] METHOD OF MANUFACTURING A VERTICAL FIELD EFFECT TRANSISTOR

[75] Inventors: Alain Chantre, Saint-Egreve; Daniel Bois, Saint-Ismier; Alain Nouailhat, Meylan, all of France

[73] Assignee: France Telecom, Paris, France

[21] Appl. No.: 910,618

[22] Filed: Jul. 8, 1992

[30] Foreign Application Priority Data

Jul. 10, 1991 [FR] France ............................ 91 08677

[51] Int. Cl.$^5$ .......................................... H01L 21/335
[52] U.S. Cl. ........................................ 437/40; 437/41;
     437/200; 437/204; 437/911
[58] Field of Search ................. 437/911, 200, 40, 203,
     437/41, 984; 257/263, 264, 265, 266

[56] References Cited

U.S. PATENT DOCUMENTS

| | | | |
|---|---|---|---|
| 4,199,771 | 4/1980 | Nishizawa et al. | |
| 4,364,072 | 12/1982 | Nishizawa | |
| 4,403,396 | 9/1983 | Stein | 437/911 |
| 4,449,284 | 5/1984 | Shimbo | 437/911 |
| 4,497,107 | 2/1985 | Cogan | 437/911 |
| 4,505,022 | 3/1985 | Briere | 437/911 |
| 4,543,706 | 10/1985 | Bencuya et al. | 437/911 |
| 4,713,358 | 12/1987 | Bulat et al. | 437/6 S |
| 4,766,088 | 8/1988 | Kono et al. | 437/52 |
| 4,952,990 | 8/1990 | Grüning | |

FOREIGN PATENT DOCUMENTS 069606 1/1983 European Pat. Off. .

OTHER PUBLICATIONS

IBM Technical Disclosure Bulletin, vol. 25, No. 3A, Aug. 1982, New York, pp. 981–982, S. P. Gaur et al. "Vertical Jfet Integrated with Self-Aligned Bipolar Process".

Primary Examiner—T. N. Quach
Attorney, Agent, or Firm—Bell, Seltzer, Park & Gibson

[57] ABSTRACT

In the method of manufacturing a vertical field effect transistor, the gate region situated on either side of the source region projecting from a main face of a semiconductive substrate consists in implanting ions on either side of the source region to form a junction, and in forming a metal silicide on the gate region made in this way. Such a transistor is particularly suitable for being integrated in various MOS technologies, and in particular in CMOS.

4 Claims, 2 Drawing Sheets

METHOD OF MANUFACTURING A VERTICAL FIELD EFFECT TRANSISTOR

The present invention relates to a method of manufacturing a vertical field effect transistor.

BACKGROUND OF THE INVENTION

In general, a vertical field effect transistor differs from a conventional field effect transistor by the fact that its conductive channel extends generally perpendicularly to the substrate, thereby offering the particular advantage of making it possible to improve the integration of such a transistor in integrated circuits.

In the vertical field effect transistors that are manufactured at present, the control gate is formed either by implanting ions (JFETs), or else by depositing metal (permeable base transistors) in the bottoms of trenches etched in the semiconductor.

From the manufacturing point of view, it is less difficult to perform an ion implanting operation to form the control gate of a vertical field effect transistor than it is to perform a metallization operation. With respect to performance, in particular switching speed, a metallized control gate gives better results than a gate formed by implanting ions because of the lower resistivity of the metallized gate. In contrast, a gate formed by implanting ions makes it possible to obtain good rectifying characteristics.

The object of the invention is to design a novel vertical field effect transistor capable of benefitting from the advantages of a transistor where the control gate is formed by implanting ions and of a transistor where the gate is metallized, without having the drawbacks thereof and while also obtaining advantages specific to this novel transistor.

SUMMARY OF THE INVENTION

To this end, the invention provides a method of manufacturing a vertical field effect transistor wherein the the control gate of the transistor is formed by making a junction on which a metal silicide is formed.

In general, an N or P channel vertical field effect transistor is made according to the invention by performing the following sequence of operations:

depositing a layer of polycrystalline silicon of a certain conductivity type on a main face of a semiconductive substrate such as a silicon substrate having an active zone forming a drain region of a predetermined conductivity type corresponding to the channel type of the transistor;

forming a source active region having the predetermined conductivity type in the layer of polycrystalline silicon and projecting from the main face of the substrate;

forming an active gate region by implanting ions having a conductivity type opposite to the predetermined conductivity type in the substrate on either side of the source region to make a junction;

depositing an insulator such as silicon oxide on the walls of the source region; and forming a metal silicide on the gate and source regions.

In general, to form the source region of the transistor, the method consists in depositing a photosensitive layer on the layer of doped polycrystalline silicon and subsequently in performing masking and photoetching operations to eliminate the photosensitive layer and the polycrystalline silicon on either side of the source region.

The operation which consists in forming the portions of insulator or "spacers" on the side walls of the source consists in depositing a layer of silicon oxide having a thickness e on the face of the substrate, then in anisotropically etching said layer, likewise over a thickness e so that silicon oxide remains only on the side walls of the source.

The operation which consists in forming a metal silicide on the gate region and on the source region is advantageously performed by a salicide method, known per se, but it may also be performed by selectively depositing a metal compound.

Finally, the operations of implanting ions to form the gate region and of forming the silicides in the source and gate regions are performed in a manner that is automatically positioned relative to the source projecting from the main face of the substrate. There is thus no need to use conventional masks that must be accurately positioned and aligned by performing manipulations that are difficult to achieve.

Overall, such a manufacturing method corresponds to making a single or elementary vertical field effect transistor that satisfies the objects of the invention.

On the basis of such an elementary structure, the invention also provides for the possibility of making an improved version to achieve a transistor that has, in particular, good operating characteristics at microwave frequencies.

Thus, the method of the invention also consists, after the step of forming the spacers, in chemically etching the doped zone of the substrate initially forming the active zone of the gate, so as to dig a space under the bottom faces of the spacers such that during the following operation of selectively depositing silicide, metal fills these previously opened spaces. After the operation of selectively depositing silicide, ions of a dopant having conductivity type opposite to the predetermined conductivity type are again implanted through the silicide to reform the junction of the grid region.

It is thus possible to form a vertical field effect transistor whose control gate has reduced resistivity, thereby making it possible to improve the operating performance of such a transistor.

Another advantage of a transistor manufactured using the method of the invention is that each step required for manufacturing the transistor can be performed using conventional techniques as are used in particular for manufacturing MOS transistors where, by analogy, the active zone of the gate projects from the main face of the substrate. This gives rise to a transistor which is easily integrated in MOS technologies, in particular in CMOS, for the purpose of forming combined JFET/CMOS components, for example.

BRIEF DESCRIPTION OF THE DRAWINGS

Embodiments of the invention are described by way of example with reference to the accompanying drawings, in which.

DETAILED DESCRIPTION

Figure 1:
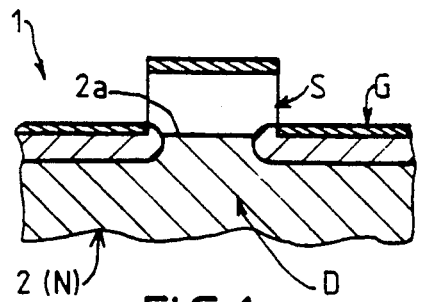
FIG. 1 is a theoretical diagram showing the structure of the control gate of a vertical field effect transistor of the invention.

In general, and with reference to FIG. 1, there can be seen the basic structure of a control gate for an N channel vertical field effect transistor manufactured using the method of the invention.

Such a vertical field effect transistor 1 is made from a semiconductive substrate such as a silicon substrate 2, and it includes an active drain region D made in the substrate 2, an active source region S projecting from the main face 2a of the substrate 2, and an active gate region G made on the face 2a of the substrate on either side of the source region S.

The method of manufacturing a transistor having the structure shown in FIG. 1 is described below with reference to FIGS. 2a to 2e.

Figure 2A:
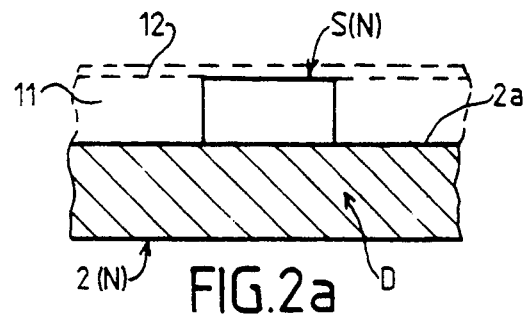
FIGS. 2a to 2d are diagrammatic sections showing the main steps in manufacturing an N channel field effect transistor of the invention in the form of an elementary version made from a substrate having N type conductivity.

With reference to FIG. 2a, a silicon substrate 2 that has previously been doped with N impurities to impart given N type conductivity thereto has a layer 11 of polycrystalline silicon deposited on a main face 2a of the substrate 2 in conventional manner during a first step.

In a second step, also illustrated by FIG. 2a, a photosensitive layer 12 is deposited on the layer 11 of polycrystalline silicon, after which the photosensitive layer 12 and the layer 11 of polycrystalline silicon are eliminated by a photoetching operation on either side of the source S which thus projects from the surface of the substrate 2.

The layer 11 of polycrystalline silicon is advantageously eliminated by a reactive ion etching operation to give the source region S side walls that are perpendicular to the main face 2a of the substrate.

Figure 2B:
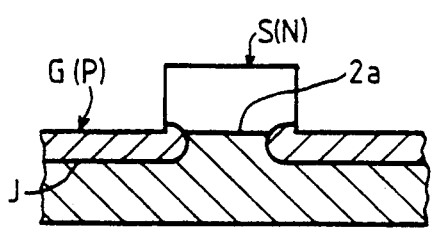

In a third step shown in FIG. 2b, ions of a P type acceptor dopant such as boron are implanted in the substrate 2 on either side of the source S to form the grid region G with the junction J. This implanting operation is performed in conventional manner, but the projecting source S is advantageously used as a mask during the implanting operation. As a result, ions are implanted in a manner which is automatically positioned relative to the source S.

At the end of this implanting operation, an annealing operation is performed to diffuse the boron ions more deeply into the substrate 2.

Figure 2C:
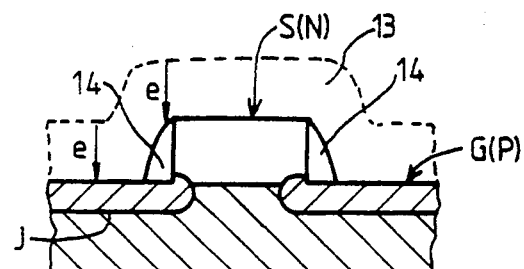

In a fourth step shown in FIG. 2c, the side walls of the source S are protected by being covered with an insulator such as silicon oxide $SiO_2$.

To do this, a layer 13 of silicon oxide is deposited on the face 2a of the substrate 2 over a thickness e, after which anisotropic etching is performed likewise over a thickness e so as to eliminate the silicon oxide except in portions adjacent to the side walls of the source S. Insulating portions called "spacers" 14 are thus formed which serve, in particular, to protect the source region S projecting from the substrate 2.

In a fifth step shown in FIG. 2d, P type ions are again implanted to increase the doping of the gate, and the source S and the gate G are silicided, advantageously by using an operation that is automatically positioned relative to the source S which is used as a mask.

The siliciding operation may be performed by any known method, e.g. by selectively depositing a metal compound on the gate zone G and on the source zone S except for the spacers 14 which overlie the side walls of the source zone S, and this operation is preferably performed by a salicide method. Such a method consists in depositing a metal layer (e.g. of titanium) on the main face 2a of the substrate 2, in performing an annealing operation so that the metal reacts on contact with silicon portions of the substrate and of the source to form titanium silicide $TiS_2$ except on the silicon oxide side walls of the source 2, and then in eliminating the layer of metal over the spacers 14. Silicided zones for the grid MG and the source MS are thus obtained.

In general, the main steps of the method of the invention as described above with reference to FIGS. 2a to 2d serve to obtain a vertical field effect transistor having an elementary structure such as that shown in FIG. 2d, i.e. a transistor in which the gate region G is formed by ions implanted in the substrate and by a silicide being applied to the implanted portion.

Figure 2D:
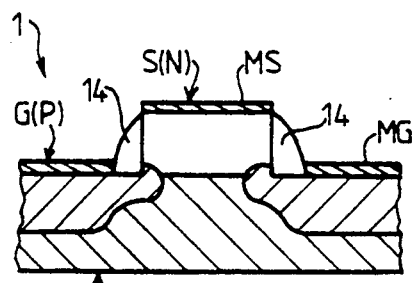
Figure 3:
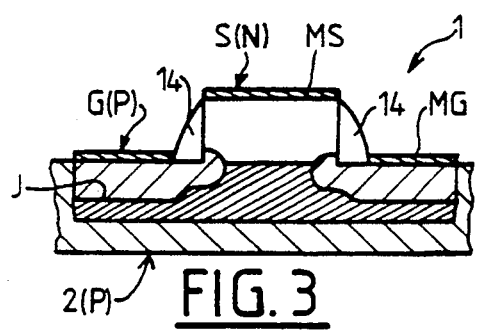
FIG. 3 is a section view through a vertical field effect transistor obtained using the method of the invention on the basis of a substrate having P type conductivity.

FIG. 3 is a section diagrammatically showing the structure of an N channel vertical field effect transistor that differs from that shown in FIG. 2d solely by the fact that the substrate 2 is a substrate having conductivity of the P type. In this case, the method of manufacturing the transistor is described above further includes a preliminary step which consists in implanting ions having N type impurities into the substrate 2, e.g. phosphorous ions, so as to form the active drain zone D, which zone then constitutes a "well".

In a variant of the method of the invention, it is possible to make an improved vertical field effect transistor having reduced gate resistance to improve its performance, particularly in the microwave range. This variant of the manufacturing method is shown in FIGS. 4a to 4d described below. The first steps of the manufacturing method up to the formation of the spacers 14 are similar to those described above with reference to FIGS. 2a to 2c, so that FIG. 4a corresponds overall to FIG. 2d, except that the ions implanted to constitute the gate region G are implanted in the surface only.

Figure 4A:
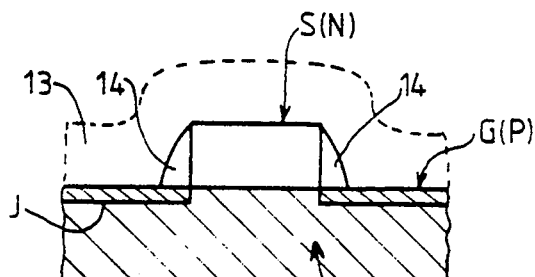
FIGS. 4a to 4d are section views for illustrating the main steps of a variant of the method of the invention for manufacturing an N channel vertical field effect transistor.
Figure 4B:
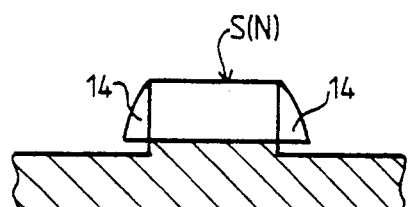

Thereafter, in a step such as that shown in FIG. 4b, this implanted zone is removed so as to undercut the substrate 2 beneath the spacers 14 situated on either side of the source region S. This removal of the implanted zone is performed by anode dissolving which is selective relative to the N doped portion of the substrate 2. That is why it is necessary to implant the ions before forming the spacers so as to make such chemical etching possible.

Figure 4C:
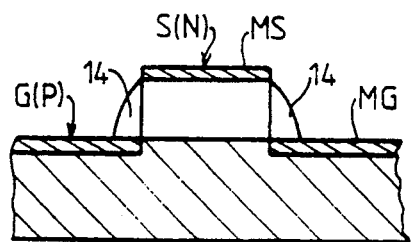
Figure 4D:
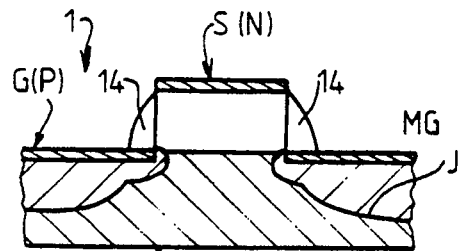

Finally, in a last step shown in FIGS. 4c and 4d, the siliciding operation is performed by selective deposition prior to further implanting ions of a p type acceptor dopant such as boron to reform the junction J inside the substrate 2. This implanting operation is designed to avoid changing the performance of the source.

Figure 5:
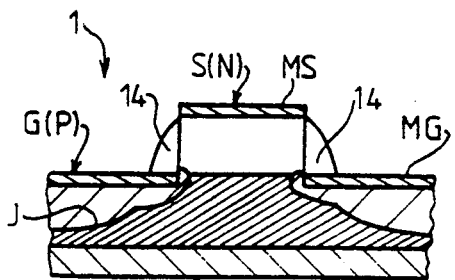
FIG. 5 is a section view through a vertical field effect transistor obtained using a variant of the method of the invention on the basis of a substrate having P type conductivity.

FIG. 5 shows a vertical field effect transistor obtained using a variant of the method in which the substrate 2 is P doped, which makes it necessary to implant ions to make an N type well prior to etching the source region S, as for the transistor shown in FIG. 3.

Naturally, the above-described method of manufacturing an N channel vertical field effect transistor is equally applicable to a P channel transistor, making appropriate allowances for the N or P conductivity type of the substrate.

In general, each step of the method of the invention for manufacturing a vertical field effect transistor makes use of operations that are commonly performed in transistor manufacture, and in particular in the manufacture of CMOS transistors. With reference to FIG. 3, it can be seen that the vertical field effect transistor has a structure which is analogous to that of a PMOS transistor whose silicon oxide layer provided between the active gate region and the substrate has been omitted.

Under such conditions, the field effect transistor of the invention is easily integrated in various MOS technologies, in particular in CMOS, thereby providing composite components, in which some of the manufacturing operations applicable to several different transistors can be performed simultaneously, for example forming the active source region of a transistor of the invention and the active gate region of a PMOS transistor.

It should also be observed that the field effect transistor of the invention is somewhat analogous to the bipolar transistor as described in document FR-2 626 406, but in which the active base region is omitted, which transistor is compatible with MOS technology. In other words, the transistor of the invention is highly advantageous with respect to compatibility between its manufacturing method and the techniques that are currently used, thereby greatly facilitating installation of the method of the invention for creating novel integrated circuits.

Naturally, the invention is not limited to the implementations described above. In particular, the method of manufacture may have additional complementary steps applied thereto, well known to the person skilled in the art, for obtaining a transistor having its own characteristics while remaining the ambit of the invention.

We claim:

1. A method of manufacturing a field effect transistor comprising the steps of:

depositing a layer of polycrystalline silicon of a given first conductivity type on a face of a semiconductor substrate;

depositing a photosensitive layer on the layer of polycrystalline silicon, masking and photoetching the photosensitive layer and the polycrystalline silicon to thereby form a source region with sidewalls from the layer of polycrystalline silicon of the given first conductivity type that upwardly projects from said substrate;

forming a first region of second conductivity type in said semiconductor substrate at said face and adjacent said source region;

forming insulating spacers on said source sidewalls, extending onto said face and over said region of second conductivity type;

removing said first region of second conductivity type under said insulating spacers;

forming a second region of second conductivity type in said semiconductor substrate at said face and adjacent said source region; and forming a gate conductor layer on said second region and extending between said insulating spacers and said face.

2. A method of manufacturing a field effect transistor, comprising the steps of:

depositing a layer of polycrystalline silicon of a given first conductivity type on a semiconductor substrate;

depositing a photosensitive layer on the layer of polycrystalline silicon, masking and photoetching the photosensitive layer and the polycrystalline silicon to thereby form a source region with sidewalls from the layer of polycrystalline silicon of the given first conductivity type that upwardly projects from said substrate;

implanting ions of a given second conductivity type in said substrate on the side of the source region to make a junction and thereby form a gate region;

covering the gate region and the source region with a layer of silicon oxide, anisotropically etching said layer of silicon oxide so as to form insulating spacers on the sidewalls of the source region;

eliminating by chemical etching the gate region previously obtained by ion implantation so as to cut away the substrate underlying the insulating spacers on the sidewalls of the source region;

forming a metal silicide on the gate and source regions; and implanting ions again to reform the junction of the gate region.

3. A method according to claim 2, wherein the step of forming the metal silicide on the gate and source regions comprises the step of depositing a silicide forming metal on the gate and source regions and annealing to form a metal silicide on the gate and source regions.

4. A method according to claim 2, wherein the step of implanting ions to make a junction is performed in a manner that is automatically positioned relative to the source projecting from the substrate.

* * * * *